(12) United States Patent
Hanzawa et al.

(10) Patent No.: US 7,885,102 B2
(45) Date of Patent: Feb. 8, 2011

(54) SEMICONDUCTOR DEVICE

(75) Inventors: Satoru Hanzawa, Hachioji (JP); Yoshikazu Iida, Higashimurayama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 114 days.

(21) Appl. No.: 12/377,271

(22) PCT Filed: Sep. 15, 2006

(86) PCT No.: PCT/JP2006/318335
§ 371 (c)(1),
(2), (4) Date: Feb. 12, 2009

(87) PCT Pub. No.: WO2008/032394
PCT Pub. Date: Mar. 20, 2008

(65) Prior Publication Data
US 2010/0214828 A1 Aug. 26, 2010

(51) Int. Cl.
*G11C 11/00* (2006.01)
(52) U.S. Cl. .............................. 365/163; 365/148
(58) Field of Classification Search .................. 365/163, 365/148, 189.16
See application file for complete search history.

(56) References Cited

U.S. PATENT DOCUMENTS

| | | | |
|---|---|---|---|
| 5,818,785 A | 10/1998 | Ohshima | |
| 6,487,113 B1 | 11/2002 | Park et al. | |
| 7,349,245 B2 * | 3/2008 | Kim et al. | 365/158 |
| 7,518,934 B2 * | 4/2009 | Bedeschi et al. | 365/189.18 |
| 7,535,747 B2 * | 5/2009 | Lee et al. | 365/148 |
| 2005/0185445 A1 | 8/2005 | Osada et al. | |
| 2007/0236987 A1 * | 10/2007 | Cho et al. | 365/163 |

FOREIGN PATENT DOCUMENTS

| | | |
|---|---|---|
| JP | 9-231760 A | 9/1997 |
| JP | 2005-267837 A | 9/2005 |
| JP | 2006-024355 A | 1/2006 |

OTHER PUBLICATIONS

Lai et al., "OUM-A 180 nm Nonvolatile Memory Cell Element Technology for Stand Alone and Embedded Applications", IEEE International Electron Devices meeting, Technical Digest, 2001, pp. 803-806.

Kang et al., "A 0.1μm 1.8V 256Mb 66MHz Synchronous Burst PRAM", IEEE International Solid-State Circuits Conference, Digest of Technical Papers, 2006, pp. 140-141.

* cited by examiner

*Primary Examiner*—Anh Phung
(74) *Attorney, Agent, or Firm*—Miles & Stockbridge P.C.

(57) ABSTRACT

In a memory array MCA which includes memory cells MC each having a variable-resistance-based memory device RQ and a select transistor MQ, an object is to receive a fixed quantity of storage data for a short time, and to realize writing operation to the memory cell, with suppressed peak current. In order to achieve the object, the data bus occupation time in rewriting operation is shortened by using plural sense amplifiers and storing storage data temporarily, and plural programming circuits are provided and activated using the control signals with different phases. By the above, the phase change memory system with low current consumption can be realized, without causing degradation of the utilization ratio of the data bus.

13 Claims, 12 Drawing Sheets

SEMICONDUCTOR DEVICE

TECHNICAL FIELD

The present invention relates to a semiconductor device and technology effective when applied to a storage device including a memory cell having an element of which resistance exhibits different values depending on storage data, in particular, a storage device including a phase change memory using a memory cell which stores data using the change of state of chalcogenide material and discriminates the data by detecting resistance difference due to the data.

BACKGROUND ART

Among technologies which the present inventors have studied, the following technology can be considered to be relevant to a semiconductor device including a phase change memory, for example.

The memory device uses, as material of a storage layer, chalcogenide material (or phase change material), such as a Ge—Sb—Te system, an Ag—In—Sb—Te system, etc. which include antimony (Sb) and tellurium (Te) at least. The property of the phase change memory using chalcogenide material is described in Non-patent Document 1, for example.

FIG. 2 is a drawing illustrating the relationship between temperature and a pulse width necessary for phase change to take place in a resistive memory device using the phase change material. When storage data '0' is written in the present memory device, a reset pulse is applied, which heats the element more than the melting point Ta of the chalcogenide material and cools it down rapidly, as illustrated in FIG. 2. By shortening the reset pulse to keep the given total energy small and setting the cool-down time t1 as narrow as about 1 ns, for example, the chalcogenide material changes to the amorphous state with high resistance.

On the contrary, when storage data '1' is written, by applying a set pulse which maintains the memory device in a temperature range lower than the melting point Ta and higher than the crystallization temperature Tx which is equal to or higher than the glass-transition temperature, the chalcogenide material changes to the polycrystalline state with low resistance. Time t2 required for crystallization changes with composition of the chalcogenide material. The temperature of the element, illustrated in FIG. 2, depends on the Joule's heat which the memory device itself generates, and the thermal diffusion to the environment.

Patent Document 1 describes a specific method to write storage data '1.' FIG. 3 illustrates a cell current pulse used for the set operation, and FIG. 4 illustrates wave-shaping circuitry used to generate the cell current pulse. In FIG. 3, a level 122 denotes a cell current amplitude at which the resistive memory device can be phase-changed to a high resistance (reset) state. By lowering the cell current amplitude gradually from the level 122 toward a low level 130, the resistive memory device is phase-changed to a low resistance (set) state. In the wave-shaping circuitry illustrated in FIG. 4, a symbol 203 denotes a power supply voltage, a symbol 205 denotes a ground voltage, a symbol 204 denotes a current source, a symbol 208 denotes a transistor used for a cell select switch, and a symbol 108 denotes a resistive memory device. Symbols 210_1-210_K denote switching transistors, and symbols 212_1-212_K denote current sources. By activating the switching transistor 208, the current of level 122 in FIG. 3 is applied to the memory device. By activating control signals C1-CK in sequence, and conducting the corresponding switching transistors 210_1-210_K, the current applied to the memory device is reduced gradually. The use of such a cell current pulse allows to shorten the fall time to about 200 ns and to shorten the set time.

Non-Patent Document 2 describes the architecture with respect to an interface (I/F) for reducing a programming current. To be specific, the programming current control of a memory chip is realized by stopping a power circuit for programming drivers, according to the number of bits to be programmed at the same time.

[Patent Document 1] U.S. Pat. No. 6,487,113

[Non-patent Document 1) IEEE International Electron Devices meeting, TECHNICAL DIGEST, (U.S.A.), 2001, pp. 803-806

[Non-patent Document 2) IEEE International Solid-State Circuits Conference, Digest of Technical Papers, (U.S.A.), 2006, pp. 140-141

DISCLOSURE OF THE INVENTION

Problems that the Invention is to Solve

As a result of study carried out by the present inventors on the technology of phase change memories described above, the following has become clear.

In the first place, the programming current of the phase change memory is studied. The study has clarified that the programming current of several 100 µA is necessary per element in order to bring the memory device into the reset state. Although the driving ability of a power circuit may change with applications, it might be unable to perform writing-in to many memory devices at once depending on the peak current permitted.

In the second place, the programming time of a phase change memory is studied. In particular, the case where a phase change memory is applied to a consumer device is considered. Generally, in the consumer device, a format and programming time of storage data are defined for every application. The programming time required for a phase change memory cell is calculated based on the definition. For example, in the case of specification in which data of N bits is rewritten in time T_PGRM, it is desirable to perform rewriting of a memory device within time [(T_PGRM/N)×M]. Here, M is a number of simultaneous programming bits. According to the above-mentioned examination, the extension of the programming time due to the increase in the number of programming bit is difficult, since the number of simultaneous programming bits M is constrained by a programming current.

In the third place, interface (I/F) configuration of a phase change memory is studied. In the case of an on-chip phase change memory mounted in a system-on-chip (SoC) represented by a microprocessor, a system bus used for transfer of data with an intellectual property (IP) module will be occupied. In the case of an off-chip phase change memory, when word composition is reduced according to the number of programming bits, rewriting operation will be performed occupying a system bus which couples among chips. Since other tasks cannot be practiced during these periods, it is likely that system performance is lowered remarkably. Similarly, when a memory array in an on-chip phase change memory or an off-chip phase change memory is arranged in banks and plural banks share an input-output (I/O) line, rewriting operation will be performed occupying the I/O line. In this case, since read operation using the so-called interleaving cannot be performed, it is likely that chip performance is lowered. Therefore, it is desired that the bus width of the system bus or the I/O line is made broader than the number of programming bits, and that time-division programming is performed while performing temporary storing and parallel-serial conversion of storage data inside a phase change memory.

An object of the present invention is to solve these problems. That is, the present invention has been made in view of the above circumstances and provides a phase change memory in which a fixed quantity of storage data is received for a short time and written in a memory cell, suppressing a peak current. The object and the other objects and the new feature of the present invention will become clear from the description of the present specification and the accompanying drawings.

Means for Solving the Problems

The following simply explains an outline of typical one of the inventions disclosed by the present application. That is, in a semiconductor device which has a phase change memory, storage data is temporarily stored using plural sense amplifiers, and a data bus is released in rewriting operation, thereby allowing other operations, such as read-out, to be performed in parallel. Plural programming circuits are provided and each of them is activated by a control signal of different phase, thereby suppressing the programming operation current. By the above, a phase change memory system of low current consumption can be realized, without causing degradation of the utilization ratio of a data bus.

Effects of the Invention

According to the present invention, in a phase change memory module, rewriting operation at low current consumption can be realized.

EXPLANATION OF REFERENCE NUMERALS

MCA: Memory array
MUX0-MUX15: Multiplexer
WDA: Array of word driver
RW0-RW15: Read and write circuit
IOBUF: Input/output data buffer
PCTL: Programming controller

BEST MODE FOR CARRYING OUT THE INVENTION

Hereafter, the embodiments of the present invention are explained in detail based on the accompanying drawings. In all diagrams for explaining the embodiments, the same symbol is attached to the same member in principle, and the repeated explanation thereof is omitted. Although not restricted in particular, a circuit element that comprises each block of an embodiment is formed typically on one semiconductor substrate such as a single crystal silicon by semiconductor integrated circuit technologies, such as publicly known CMOS (complementary MOS transistor). The chalcogenide material or the like which indicates phase change are used as a hybrid by the production technology of an integrated circuit.

Embodiment 1

Figure 1:
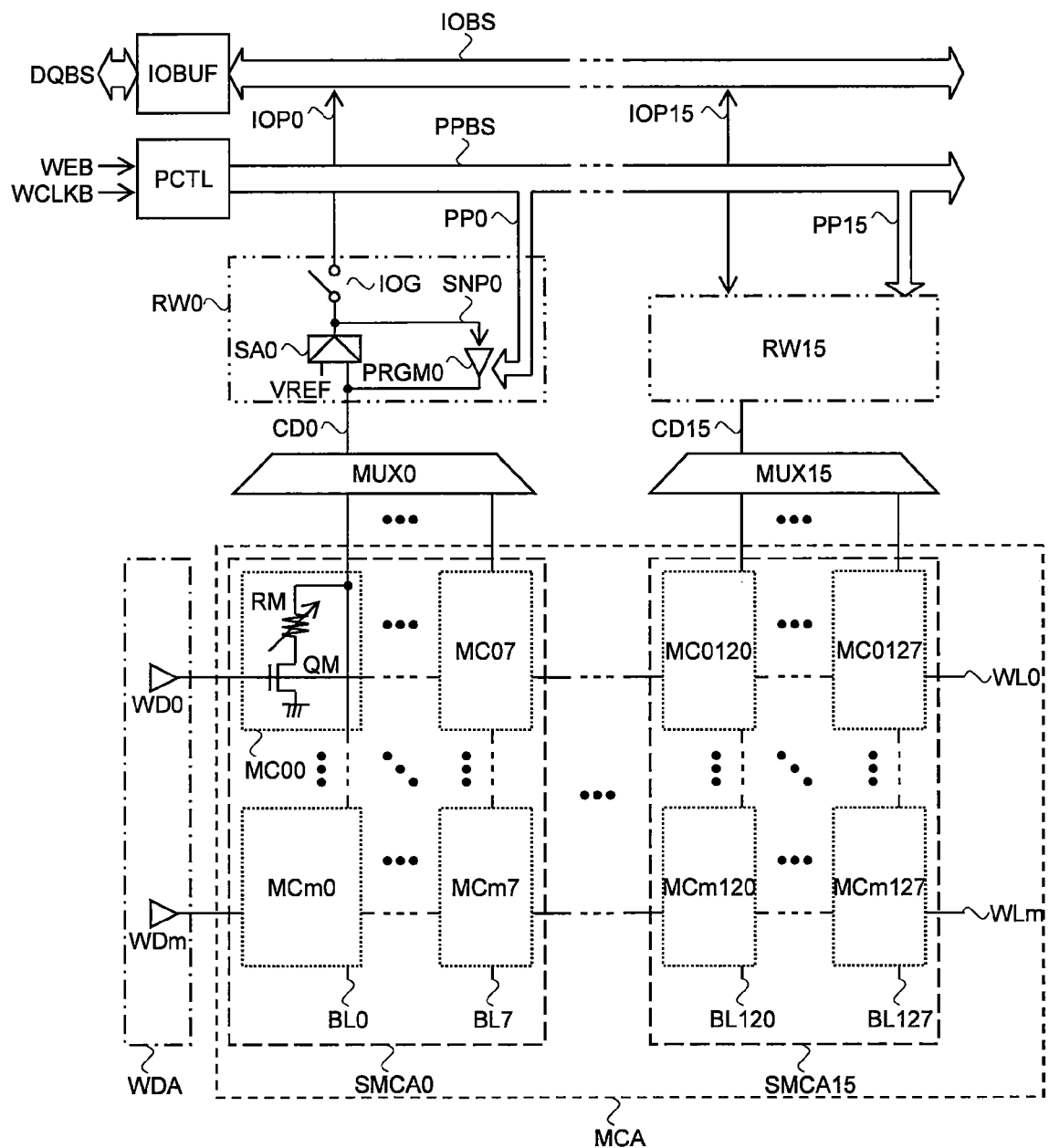
FIG. 1 is a drawing illustrating an example of configuration of a main circuit block of a phase change memory module included in a semiconductor device according to Embodiment 1 of the present invention.

FIG. 1 illustrates an example of configuration of a main block of a memory module according to Embodiment 1 of the present invention. That is, the phase change memory concerned includes a memory array MCA, multiplexers MUX0-MUX15, an array of word drivers WDA, read and write circuits RW0-RW15, an input/output data buffer IOBUF, and a programming controller PCTL. FIG. 1 illustrates the memory array MCA which is configured by plural memory cells of (m+1) rows×128 columns as an example. Memory cells MC00-MC(m+1)127 are arranged at each intersection of bit lines BL0-BL127 and word lines WL0-WLm which are the output of the array of word drivers WDA. Each memory cell has the configuration that a memory device RM and a select transistor QM are coupled in series and inserted between a bit line and a ground voltage VSS terminal. The word line is coupled to a gate of the select transistor QM. Eight bit lines are combined to the read and write circuits RW0-RW15 through the multiplexers MUX0-MUX15, each of which is arranged for every eight bit lines. Each of the multiplexers MUX0-MUX15 selects one of eight bit lines, and electrically couples it to the corresponding one of the read and write circuits RW0-RW15. Owing to such configuration, the positions of memory cells accessed continuously or at the same time can be detached from each other in the rewriting operation and the read operation to be described later. Therefore, the heat that a select memory cell receives from the surrounding memory cells can be suppressed. That is, it becomes possible to avoid what is called thermal disturbance. In order to clarify arrangement relationship of the memory array MCA and the read and write circuits RW0-RW15 in the following, a memory array will be blocked for every 16 pieces of the bit lines, and each block will be called sub-arrays SMCA0-SMCA15.

The read and write circuit RW0, for example, includes a sense amplifier SA0, a programming circuit PRGM0, and an input/output gate IOG. The read and write circuit RW0 sends and receives storage data to and from an input/output buffer IOBUF and a data bus DQBS through an input/output gate IOG0 and a pair of input/output buses IOP0 in an input/output bus IOBS. The sense amplifier SA0 and the programming circuit PRGM0 are coupled each other through a common data line CD0 on the side of the multiplexer MUX0 and through a pair of sensing nodes SNP0 on the side of the input/output gate IOG. A reference voltage VREF used in the read operation of storage data is inputted to the sense amplifier SA0. The programming circuit PRGM0 is controlled by a block of programming control signals PP0 inputted from a programming controller PCTL through a programming signal bus PPBS. The programming controller PCTL generates the block of programming control signals PP0 in response to a programming enable signal WEB and a programming clock WCLKB.

Figure 5:
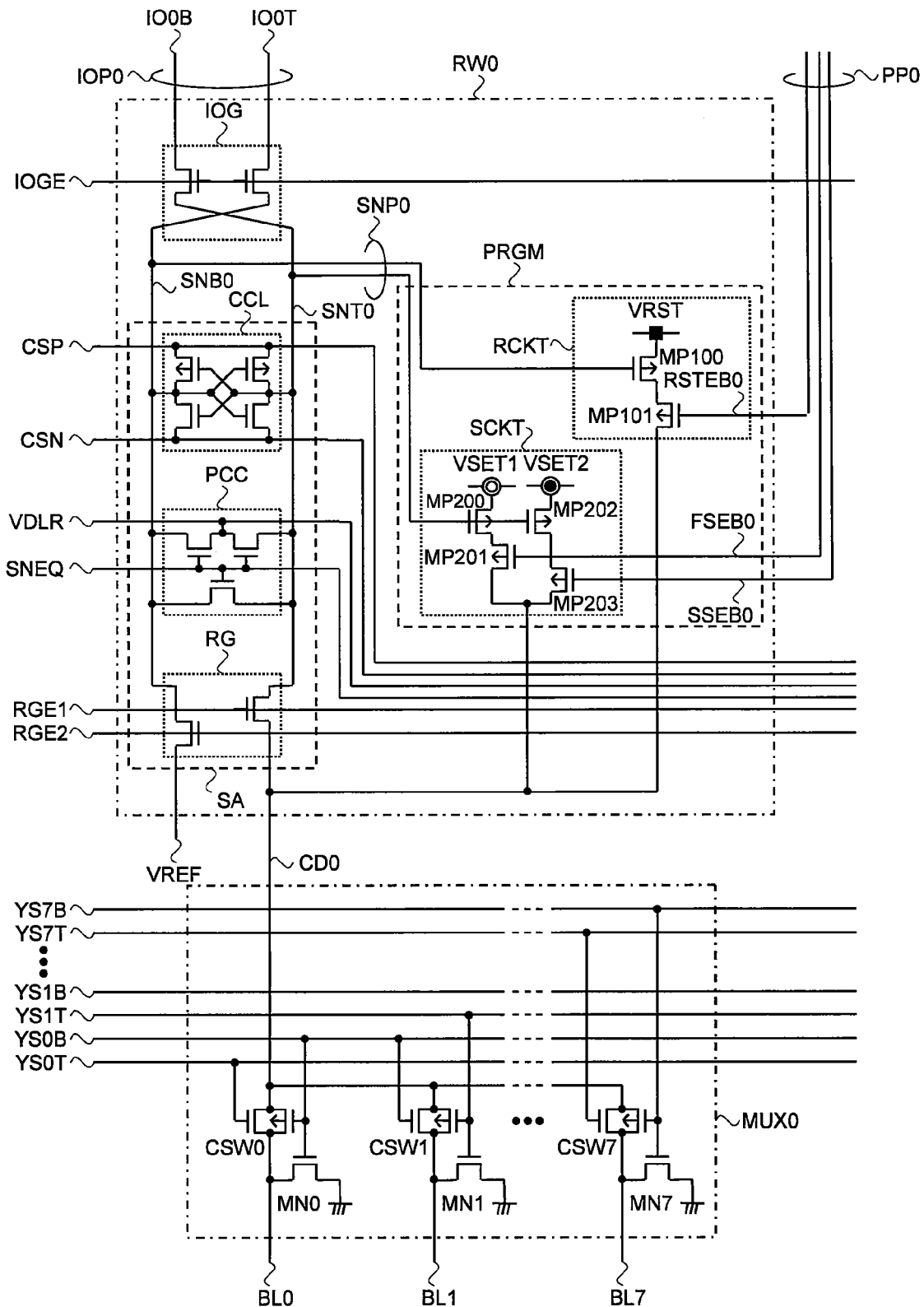
FIG. 5 is a drawing illustrating another example of detailed configuration of a read and write circuit as illustrated in FIG. 1, which is included in the semiconductor device according to Embodiment 1 of the present invention.

FIG. 5 illustrates specific configuration of the main circuit block of the memory module illustrated in FIG. 1, taking the multiplexer MUX0 and the read and write circuit RW0 for example. The multiplexer MUX0 includes CMOS transfer gates CSW0-CSW7 and NMOS transistors MN0-MN7 for electric discharge. The CMOS transfer gates CSW0-CSW7 are inserted respectively between a common data line CD0 and bit lines BL0-BL7, and serve as column select switches. A pair of column select lines (YS0T, YS0B)-(YS7T, YS7B), which are output signals of a column decoder (not shown in FIG. 5), are coupled to the gate electrodes of the CMOS transfer gates CSW0-CAW7, respectively. When one of the pair of column select lines (YS0T, YS0B)-(YS7T, YS7B) is activated, a corresponding CMOS transfer gate is activated and one of the bit lines BL0-BL7 is coupled to the common data line CD0. The NMOS transistors MN0-MN7 are inserted respectively between the bit lines BL0-BL7 and a ground voltage VSS terminal, and the column select line YS0B-YS7B are coupled to the gate electrodes, respectively. At the time of standby, the column select lines YS0B-YS7B are held at the power supply voltage VDD, and the NMOS transistors MN0-MN7 are conducted; accordingly, the bit lines BL0-BL7 are driven to the ground voltage VSS. The pair of column select lines (YS0T, YS0B)-(YS7T, YS7B) are also coupled in common to the other multiplexers MUX1-MUX7.

Next, the read and write circuit RW0 is explained in the order of the sense amplifier SA0, the programming circuit PRGM0, and the input/output gate IOG0. The sense amplifier SA0 includes a read gate RG, a pre-charge circuit PCC, and a cross-couple type sense-latch CCL. The read gate RG has an NMOS transistor pair, one is inserted between one of a pair of sensing nodes SNP0 (namely, a sensing node SNB0) and the reference voltage VREF, and the other is inserted between the other one of the pair of sensing nodes SNP0 (namely, a sensing node SNT0) and the common data line CD0. A first read gate enable signal RGE1 is coupled to a gate electrode of the transistor pair on the side of the common data line CD0. A second read gate enable signal RGE2 is coupled to a gate electrode of the transistor pair on the side of the reference voltage VREF. In read operation, the read gate enable signals RGE1 and RGE2 are driven from the ground voltage VSS to the power supply voltage VDD, and the transistor pair is conducted. Accordingly, the pair of sensing nodes SNP0 are coupled to the common data line CD0 and to the reference voltage VREF, respectively. In this state, a read signal is generated from the bit line to the pair of sensing nodes SNP0. At the time of amplification of the read signal, the read gate enable signals RGE1 and RGE2 are driven from the power supply voltage VDD to the ground voltage VSS, and the bit line and the pair of sensing nodes SNP0 are cut off. Accordingly, it becomes possible to mitigate and equalize the load capacitance of the pair of sensing nodes SNP0, realizing a high-speed and reliable read operation. The read gate enable signal RGE is also coupled similarly to the read gates in other read and write circuits RW1-RW7.

The pre-charge circuit PCC is a publicly known circuit which has three NMOS transistors. The transistors are inserted between a read voltage VDLR supply and the pair of sensing nodes SNP0. The remaining transistor is inserted between the sensing nodes SNT0 and SNB0. A sensing node equalize signal SNEQ is inputted into the gate electrodes of these transistors. At the time of standby, the sensing node equalize signal SNEQ is held at the power supply voltage VDD, and each of the transistors is conducted; accordingly, the pair of sensing nodes SNP0 are driven to the reading voltage VDLR. In the early stage of the read operation, the pre-charge circuit PCC drives to the reading voltage VDLR the bit line which is selected through the read gate RG and the column select switch in the multiplexer MUX0. Here, the reading voltage VDLR is set to a value which is lower than the power supply voltage VDD and which does not destroy the storage data of the memory cell, that is, to a voltage of the degree that the resistive memory device does not undergo phase change. The sensing node equalize signal SNEQ is also coupled similarly to the pre-charge circuits in other read and write circuits RW1-RW7. In the present embodiment, the pre-charge circuit PCC is not provided for every bit lines BL0-BL120, but is provided within the sense amplifier SA0 which is provided in common for plural bit lines. By this configuration, the area can be made small. Furthermore, in the present embodiment, the pre-charge circuit PCC and the bit line BL are coupled through the read gate RG. Therefore, since the pre-charge circuit PCC can be separated from the bit line by the read gate RG, it is not necessary to control the pre-charge circuit PCC at the time of writing operation. Therefore, control of the pre-charge circuit PCC becomes easy and activation of a control signal becomes unnecessary; accordingly, low power consumption is realizable.

The sense-latch CCL is a publicly known circuit which has two PMOS transistors and two NMOS transistors. Common source lines CSP and CSN currently held at the reading voltage VDLR are activated by being respectively driven to the power supply voltage VDD and the ground voltage VSS, and amplify a small read signal generated between the pair of sensing nodes SNP0. The common source lines CSP and CSN are also coupled similarly to the sense-latches in other read and write circuits RW1-RW7.

Figure 2:
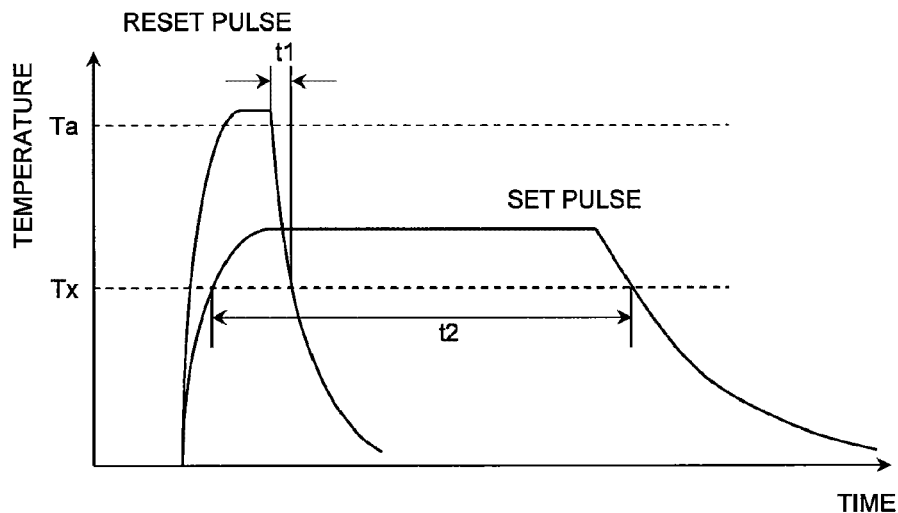
FIG. 2 is a drawing illustrating the relationship of temperature and a pulse width necessary for phase change to take place in a resistive element using the phase change material.

The programming circuit PRGM includes a reset circuit RCKT and a set circuit SCKT. The reset circuit RCKT has, for example, PMOS transistors MP100 and MP101 which are coupled in series between a reset voltage supply line VRST and the common data line CD0. The sensing node SNB0 is coupled to a gate electrode of the transistor MP100. A reset enable signal RSTE0 in the block of programming control signals PP0 is coupled to a gate electrode of the transistor MP101. Here, the reset voltage VRST is set to a value which is the same as the power supply voltage VDD, or to a voltage of the degree that the voltage can flow a current that makes a memory device exceed a melting point as illustrated in FIG. 2.

Figure 3:
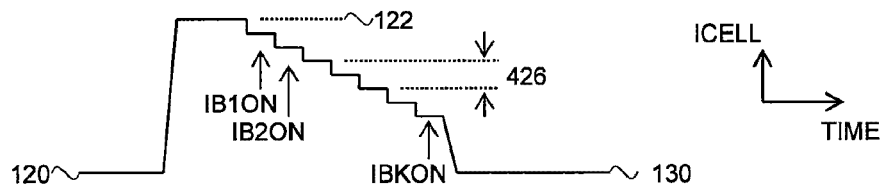
FIG. 3 is a drawing illustrating an example of configuration of a circuit which generates a cell current pulse with slow falling time, as described in the Patent Document.
Figure 4:
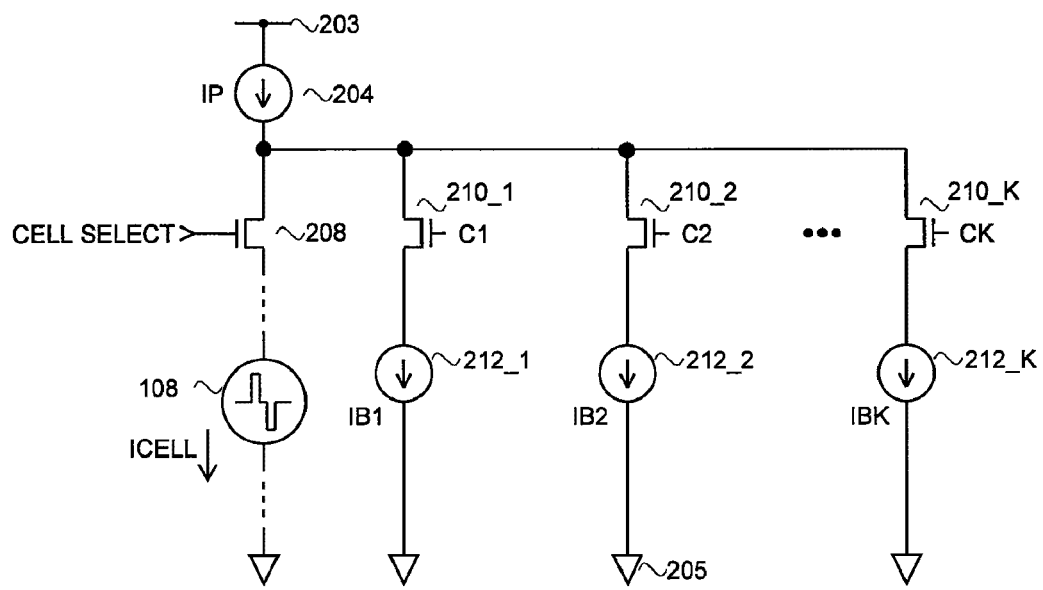
FIG. 4 is a drawing illustrating a cell current pulse generated by using the circuit illustrated in FIG. 3.

The set circuit SCKT has four PMOS transistors MP200, MP201, MP202, and MP203. The transistors MP200 and MP201 are coupled in series between a first set voltage supply line VSET1 and the common data line CD0. The transistors MP202 and MP203 are coupled in series between a second set voltage supply line VSET2 and the common data line CD0. The sensing node SNT0 is coupled to gate electrodes of the transistors MP200 and MP202. A first set enable signal FSE0 in the block of programming control signals PP0 is coupled to a gate electrode of the transistor MP201. A second set enable signal SSE0 in the block of programming control signals PP0 is coupled to a gate electrode of the transistor MP203. Here, the first set voltage VSET1 is set to a value which is the same as the power supply voltage VDD, or to a voltage of the degree that the voltage can flow a current that makes a memory device exceed a melting point as described in the explanation of FIG. 2 and FIG. 4. Therefore, it is also possible to set the reset voltage VRST to the same voltage. In this case, the number of supply lines can be reduced. The second set voltage VSET2 is set to a voltage level lower than the first set voltage VSET1. The configuration in which two set voltages are supplied as described above leads to possible shortening of the set time. Although the present embodiment illustrates the configuration in which two set voltages are supplied, the cell current of the shape illustrated in FIG. 4 can also be driven by extending to the circuit configuration as illustrated in FIG. 3.

The input/output gate IOG0 has an NMOS transistor pair inserted between the pair of sensing nodes SNP0 (namely, sensing nodes SNT0, SNB0) and a pair of input/output buses IOP0 (namely, input/output lines IO0T, IO0B). An input/output gate enable signal IOGE is coupled to gate electrodes of the transistor pair. In read operation or rewriting operation, the present input/output gate enable signal IOGE is driven from the ground voltage VSS to the power supply voltage VDD, and the transistor pair is conducted. As the result, the pair of sensing nodes SNP0 and the pair of input/output buses IOP0 are coupled, and transfer of the storage data is performed. Since the input/output gate enable signal IOGE is also coupled in common to the input/output gate in other read and write circuits RW1-RW15, the 16-bit data transferred in parallel along the input/output bus IOBS is taken into the corresponding read and write circuits RW0-RW15 at the same time. By the above-described configuration of the read and write circuits RW0-RW15, the rewriting operation in which the sense amplifiers SA0-SA15 are used for write buffers can be performed as described below.

In FIG. 1, the read and write circuit RW0 is provided for one sub-array, however, the read and write circuit RW0 may be provided for two sub-arrays and may be shared by the two sub-arrays. In this case, what is necessary is to select either of the two sub-arrays using the read gate RG and to couple the sense amplifier SA to the selected sub-array. Furthermore, what is necessary is to select the output of the programming circuit PRGM using a gate circuit.

Figure 6:
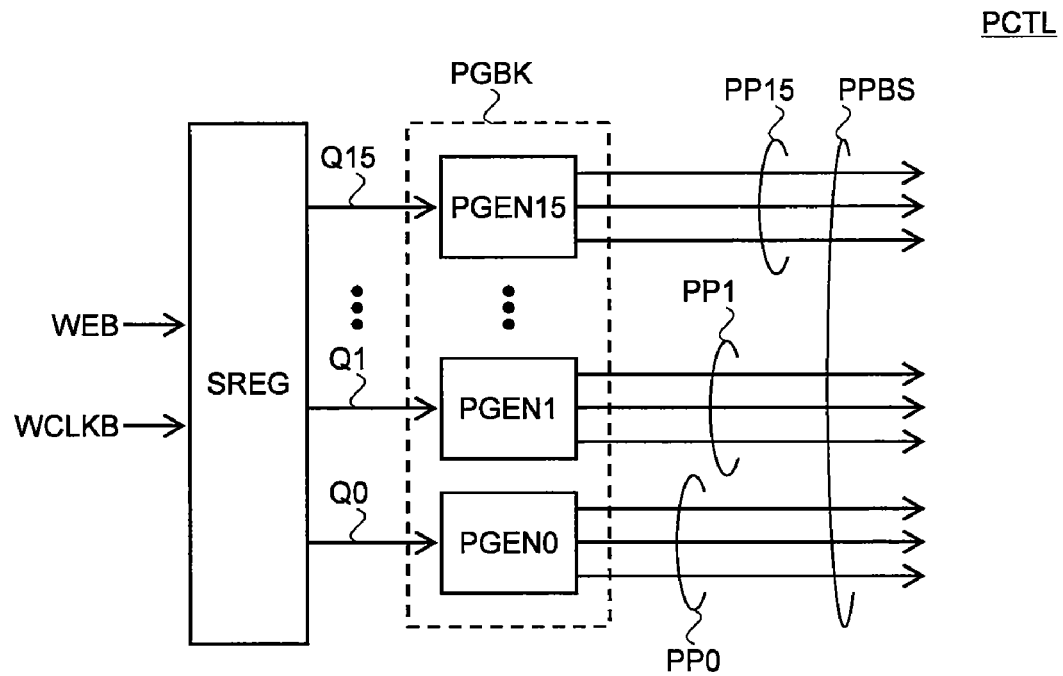
FIG. 6 is a drawing illustrating an example of configuration of a block of programming controller included in the semiconductor device according to Embodiment 1 of the present invention.

FIG. 6 illustrates an example of configuration of the programming controller PCTL illustrated in FIG. 1. This circuit includes a shift register SREG and a block of programming signal generator PGBK. The shift register receives the programming enable signal WEB and the programming clock WCLKB, and outputs programming bit control signals Q0-Q15 which are different in phase. The block of programming signal generator PGBK has programming signal generators PGEN0-PGEN15. The programming signal generators PGEN0-PGEN15 receive the corresponding programming bit control signals Q0-Q15, respectively, and generate the block of programming control signals PP0-PP15. The block of programming control signals PP0-PP15 have respectively a reset enable signal, a first set signal, and a second set signal, like the block of programming control signals PP0 described above. The block of programming control signals PP0-PP15 will be collectively called a programming signal bus PPBS. In this way, in the present embodiment, the programming controller PCTL outputs the block of programming control signals PP0-PP15, each corresponding to each programming circuit. Accordingly, it becomes possible to independently control the supply timing and to suppress the peak current.

Figure 7:
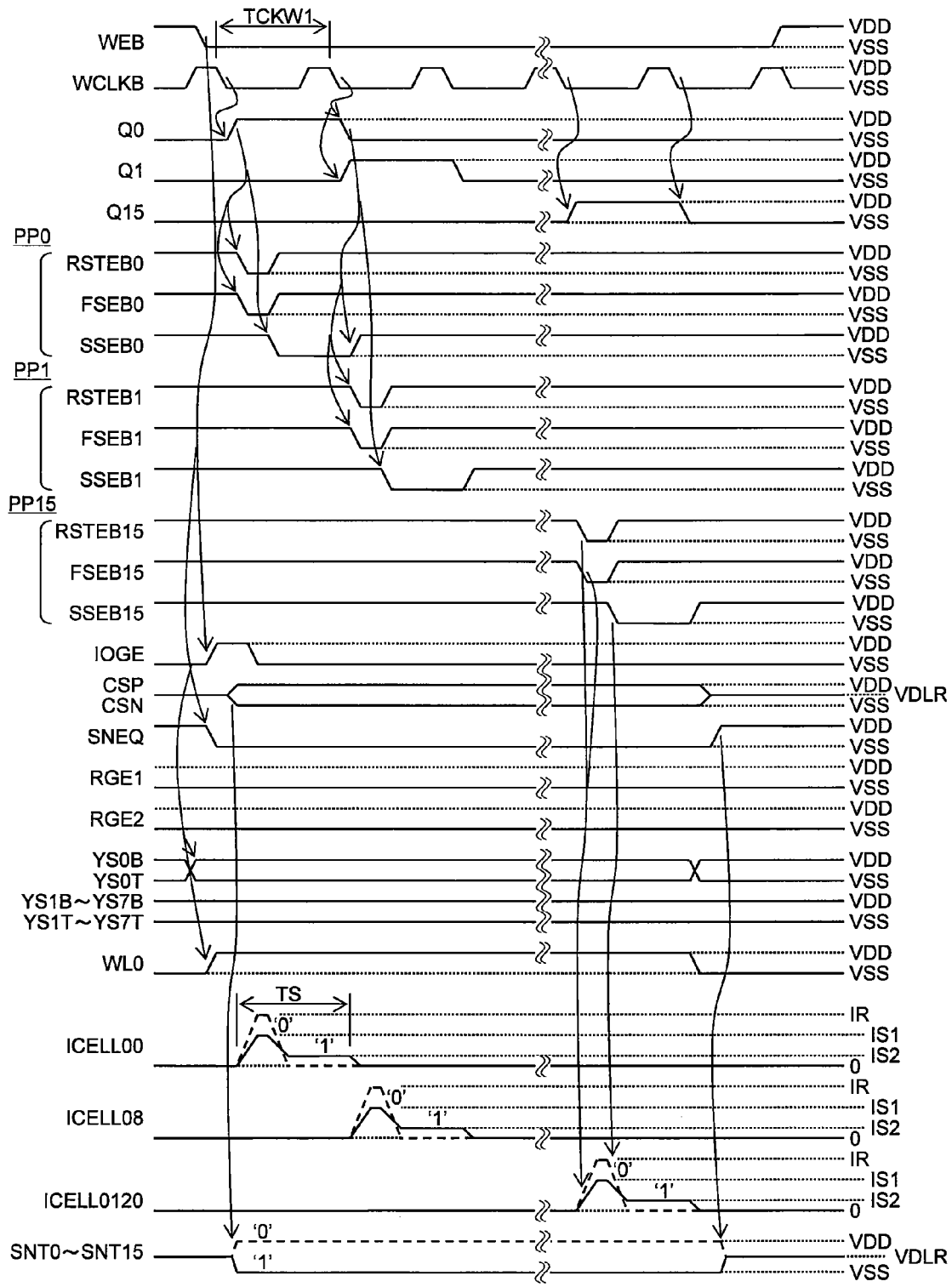
FIG. 7 is a drawing illustrating an example of a timing diagram in rewriting operation of the phase change memory module of FIG. 1.

FIG. 7 illustrates an example of a timing diagram in rewriting operation of the phase change memory module illustrated in FIG. 1. Here, an example is explained for the operation in rewriting storage data of 16 memory cells MC00, MC08, - - - , MC0120 which are chosen every eight cells out of 128 memory cells and arranged on a word line WL0.

First, the operation of the programming controller PCTL is explained. The programming controller PCTL is activated by driving the programming enable signal WEB from the present power supply voltage VDD to the ground voltage VSS. That is, synchronizing with the falling edge of the programming clock WCLKB, the shift register SREG in the programming controller PCTL generates programming control signals Q0-Q15 in sequence at the interval of cycle time TCKW1 of the programming clock WCLKB. The programming signal generators PGEN0-PGEN15 receive the corresponding programming control signals Q0-Q15, and output short reset enable signals RSTB0-RSTB15 and first set enable signals FSEB0-FSEB15 in sequence. After driving these enable signals from the ground voltage VSS to the power supply voltage VDD, the programming signal generators PGEN0-PGEN15 generate second set enable signals SSEB0-SSEB15 in sequence.

Next, the operation of the memory array is explained. In order to simplify the explanation about the operation of the read and write circuits RW0-RW15, the explanation will be made in detail, focusing on the read and write circuit RW0 in particular. First, when the programming enable signal WEB is driven from the present power supply voltage VDD to the ground voltage VSS, the sensing node equalize signal SNEQ is driven from the present power supply voltage VDD to the ground voltage VSS. Accordingly, the pre-charge circuit PCC in the sense amplifier is brought to a non-active state. The pair of input/output buses IOP0 and the pair of sensing nodes SNP0 are coupled each other by driving the input/output gate enable signal IOGE from the present ground voltage VSS to the power supply voltage VDD, and the sense-latch CCL is activated by driving the common source lines CSP and CSN from the present reading voltage VDLR to the power supply voltage VDD and the ground voltage VSS, respectively. Accordingly, storage data is taken in. Here, the storage data '0' corresponds to a memory cell in a high resistance (reset) state, and the sensing node SNT0 is driven to the power supply voltage VDD. On the other hand, the storage data '1' corresponds to a memory cell in a low resistance (set) state, and the sensing node SNT0 is driven to the ground voltage VSS. The sense amplifiers SA1-SA15 in other read and write circuits RW1-RW15 also take in storage data in a similar manner.

By activating the pair of column select signals (YS0T, YS0B) in parallel with these operations, the bit lines BL0, BL8, - - -, BL120 and the corresponding programming circuits PRGM0-PRGM15 are coupled. Furthermore, by driving the word line WL0 from the present ground voltage VSS to the power supply voltage VDD, the programming circuits PRGM0-PRGM15 and the memory cells MC00, MC08, - - -, MC0120 are coupled to form current paths. When the storage data '0' is written in the memory cell MC00, the reset circuit RCKT in the programming circuit PRGM0 within the read and write circuit RW0 is activated. Accordingly, a cell current ICELL00 of a value IR corresponding to the reset voltage VRST is applied to the memory cell MC00. On the other hand, when the storage data '1' is written, the set circuit SCKT is activated. Accordingly, the cell current CELL00 of values IS1 and IS2 corresponding to the first set voltage VSET1 and the second set voltage VSET2, respectively, are applied to the memory cell MC00 in sequence. Here, since the first set voltage VSET1 is equal to or lower than the reset voltage VRST, the cell current IS1 is equal to or smaller than the value IR. Sum total of the time when the cell currents IS1 and IS2 are applied is equal to a cycle time TCKW1 of the programming clock WCLKB. Therefore, corresponding to the generation of the programming control signals Q0-Q15, the cell currents ICELL0, ICELL8, - - -, ICELL120 are applied to the memory cells MC00, MC07, - - -, MC120, in sequence at intervals of the cycle time TS. Finally, The pair of column select signals (YS0T, YS0B) is brought into the non-active state, and the word line WL0 is driven from the present power supply voltage VDD to the ground voltage VSS. The common source signals CSP and CSN are driven to the reading voltage VDLR, and the sensing node equalize signal SNEQ is driven from the present ground voltage VSS to the power supply voltage VDD. Accordingly, the pair of sensing nodes SNP0-SNP15 are driven to the reading voltage VDLR. Further, the programming enable signal WEB is driven from the present ground voltage VSS to the power supply voltage VDD, and the system returns to the standby state.

Figure 8:
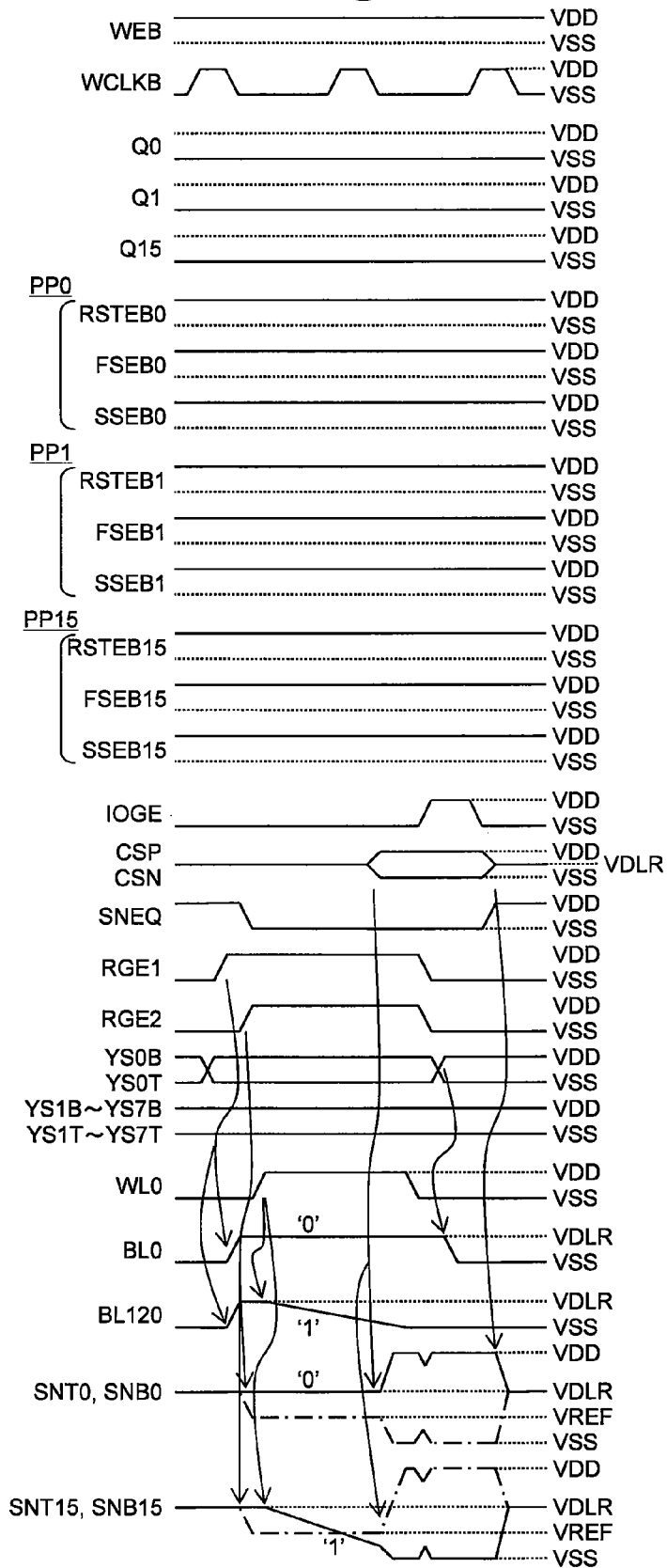
FIG. 8 is a drawing illustrating an example of a timing diagram in read operation of the phase change memory module of FIG. 1.

FIG. 8 illustrates an example of a timing diagram in read operation of the phase change memory module illustrated in FIG. 1. Here, similar to the rewriting operation described above, an example is explained for the operation in reading out storage data of 16 memory cells MC00, MC08, - - -, MC0120 which are chosen every eight cells out of 128 memory cells and arranged on the word line WL0. In order to make the explanation simple, it is assumed that the memory cell MC00 stores data '0' and that the memory cell MC0120 stores data '1'; and the explanation will be made in detail, focusing on the read and write circuits RW0 and RW15 in particular. The feature of the present read operation is not that data is read per one bit in a time division manner as in rewriting operation, but that data of 16 bits is read at the same time.

In the read operation, since the programming enable signal WEB is held at the power supply voltage VDD, the programming control signals Q0-Q15 are also held at the ground voltage VSS. When the read operation is started, the pair of column select signals (YS0T, YS0B) are activated, and the first read gate enable signal RGE1 is driven from the present ground voltage VSS to the power supply voltage VDD. Accordingly, one of the transistors in the read gate RG is conducted, and Bit lines BL0, BL8, - - -, BL120 are coupled to the corresponding sense amplifiers SA0-SA15 in the read and write circuits RW0-RW15. These bit lines are driven from the ground voltage VSS to the reading voltage VDLR by the pre-charge circuits PC0-PC15 in the corresponding sense amplifiers SA0-SA15. The reading voltage VDLR is set to a voltage by which data is not destroyed. Preferably, the reading voltage VDLR is set to a voltage smaller than the second set voltage VSET2, so that the read disturbance can be prevented. Next, the sensing node equalize signal SNEQ is driven from the present power supply voltage VDD to the ground voltage VSS, and the pre-charge circuits PC0-PC15 are brought to the non-active state. Then, the second read gate enable signal RGE2 is driven from the present ground voltage VSS to the power supply voltage VDD, and the sensing nodes SNB0-SNB15 are driven to the reference voltage VREF. Subsequently, by driving the word line WL0 from the present ground voltage VSS to the power supply voltage VDD, and by activating the memory cells MC00, MC08, - - -, MC0120, the bit lines BL0, BL8, - - -, BL120 are driven. Since the memory cell MC00 is in the high resistance state corresponding to the storage data '0' at present, the voltage of the bit line BL0 is maintained nearly at the reading voltage VDLR. On the other hand, since the memory cell MC0120 is in the low resistance state corresponding to the storage data '1', the voltage of the bit line BL120 is driven from the reading voltage VDLR toward the ground voltage VSS. At the time when the voltage of the bit line BL120 becomes sufficiently less than the reference voltage VREF, the common source lines CSP and CSN are driven from the present reading voltage VDLR to the power supply voltage VDD and to the ground voltage VSS, respectively, and the sense amplifiers SA0-SA15 are activated. Accordingly, the read signals generated at the pair of sensing nodes SNP0-SNP15 are amplified.

After the amplification of the read signals, the word line WL0 and the read gate enable signals RGE1 and RGE2 are driven from the present power supply voltage VDD to the ground voltage VSS. The pair of column select signals (YS0T, YS0B) are brought to the non-active state. Further, by driving the input/output gate enable signal IOGE from the present ground voltage VSS to the power supply voltage VDD, the data is read from the sense amplifiers SA0-SA15 to the pair of input/output buses IOP0-IOP15. Finally, the input/output gate enable signal IOGE is driven from the present power supply voltage VDD to the ground voltage VSS, and the common source lines CSP and CSN are driven to the reading voltage VDLR, and subsequently brought to the non-active state. By driving the sensing node equalize signal SNEQ from the present ground voltage VSS to the power supply voltage VDD, the pair of sensing nodes SN0-SN15 are driven to the reading voltage VDLR, and the system returns to the standby state.

Figure 10:
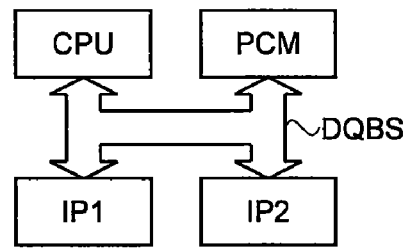
FIG. 10 is a drawing illustrating an example of entire configuration of the phase change memory module of FIG. 1.
Figure 9:
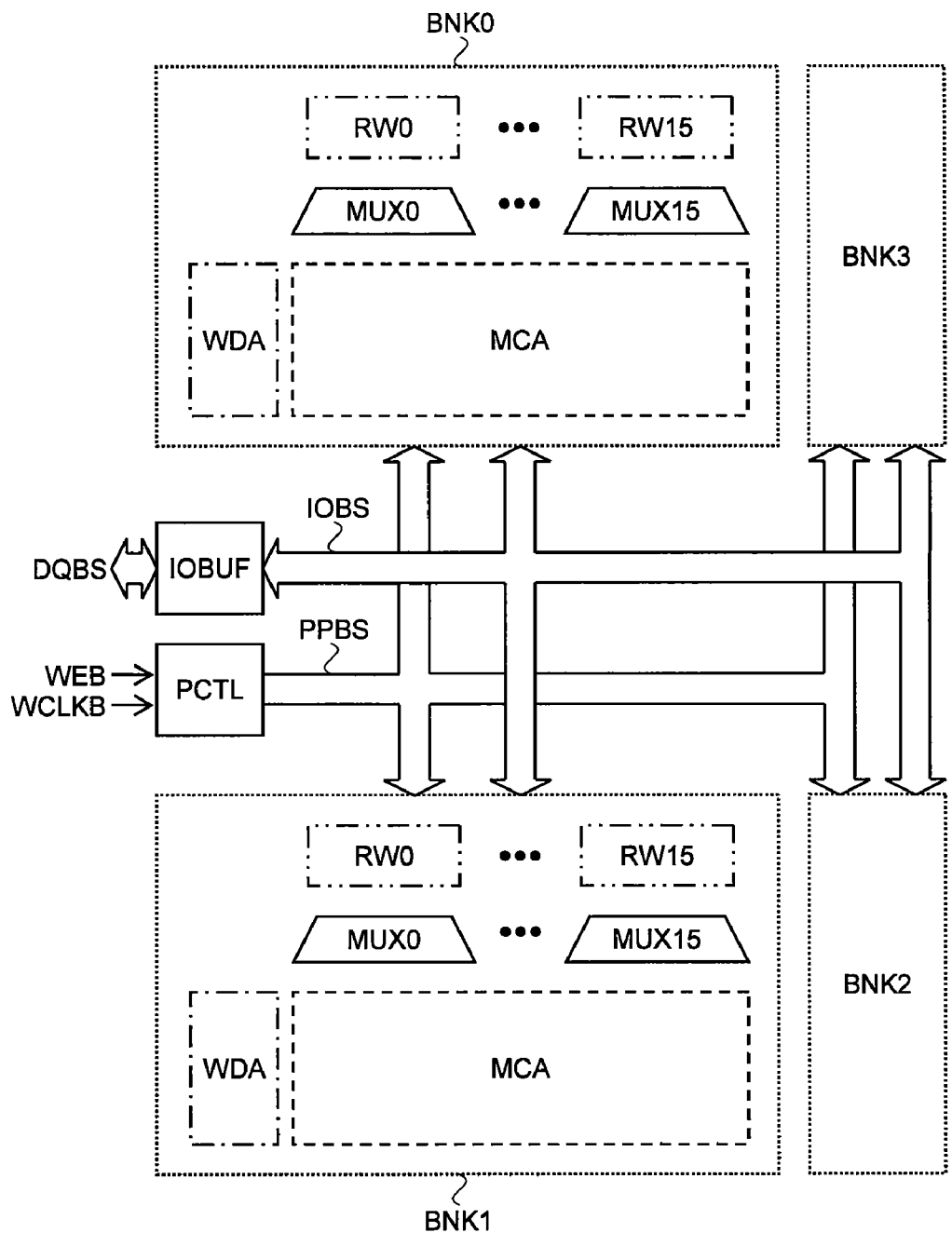
FIG. 9 is a drawing illustrating an example of entire configuration of the phase change memory module of FIG. 1.

FIG. 9 is a drawing illustrating an example of the overall configuration of the phase change memory module according to the present embodiment. The feature of the present memory module PCM is that the memory module PCM has plural banks (banks BNK0-BNK3 in the present example). Each of the banks BNK0-BNK3 has the same configuration as the memory array illustrated in FIG. 1. Even in the midst of writing storage data in the bank BNK0 for example, by the time-division programming in which the above-described sense amplifier is used as a write buffer, the input/output bus IOBS can be released for other use; therefore, it becomes possible to perform the read operation/writing operation with other banks. That is, the bank interleaving can be performed and the utilization ratio of the input/output bus IOBS can be improved. That is, the throughput of the module can be improved FIG. 10 is a drawing illustrating an example of configuration of SoC which mounts the phase change memory module illustrated in FIG. 9. In the present SoC, the phase change memory module PCM is coupled with a central processing unit CPU and intellectual properties IP1 and IP2 through a data bus DQBS. The intellectual properties IP1 and IP2 are modules which perform image processing, security surveillance, etc. Due to the configuration and operation described above, the data bus DQBS can be released for other use, even in the midst of writing storage data in the phase change memory module; therefore, it is possible for the central processing unit CPU to access the other modules IP1 and IP2, leading to improvement of the system performance.

The effect due to the configuration and operation of the phase change memory module described above is summarized in the following. First, by dividing the memory array MCA into the sub-arrays SMCA0-SMCA15, by arranging the plural multiplexers MUX0-MUX15 and read and write circuits RW0-RW15, and by making the interval of the select bits on the select word line wider, the heat that a select memory cell receives from the surrounding memory cells can be suppressed. That is, it becomes possible to avoid what is called thermal disturbance. Second, by generating the block of programming control signals PP0-PP15 with respectively different phases with the use of the programming controller PCTL, and by activating the programming circuit for every cycle, it is possible to perform the time-division programming. Consequently, the peak value of the programming current can be suppressed. Third, by employing the programming circuit configuration which generates the block of programming control signal and the cell current corresponding to the voltage of the pair of sensing nodes, it is possible to perform the rewriting operation using the sense amplifier as the programming buffer. That is, by releasing the input/output line bus and the data bus for other use even in the course of rewriting operation, it is possible to improve the use efficiency of the bus, and hence, it is possible to improve the throughput. From the above, it is possible to realize a high-speed phase change memory module with a small programming current.

Embodiment 2

Figure 11:
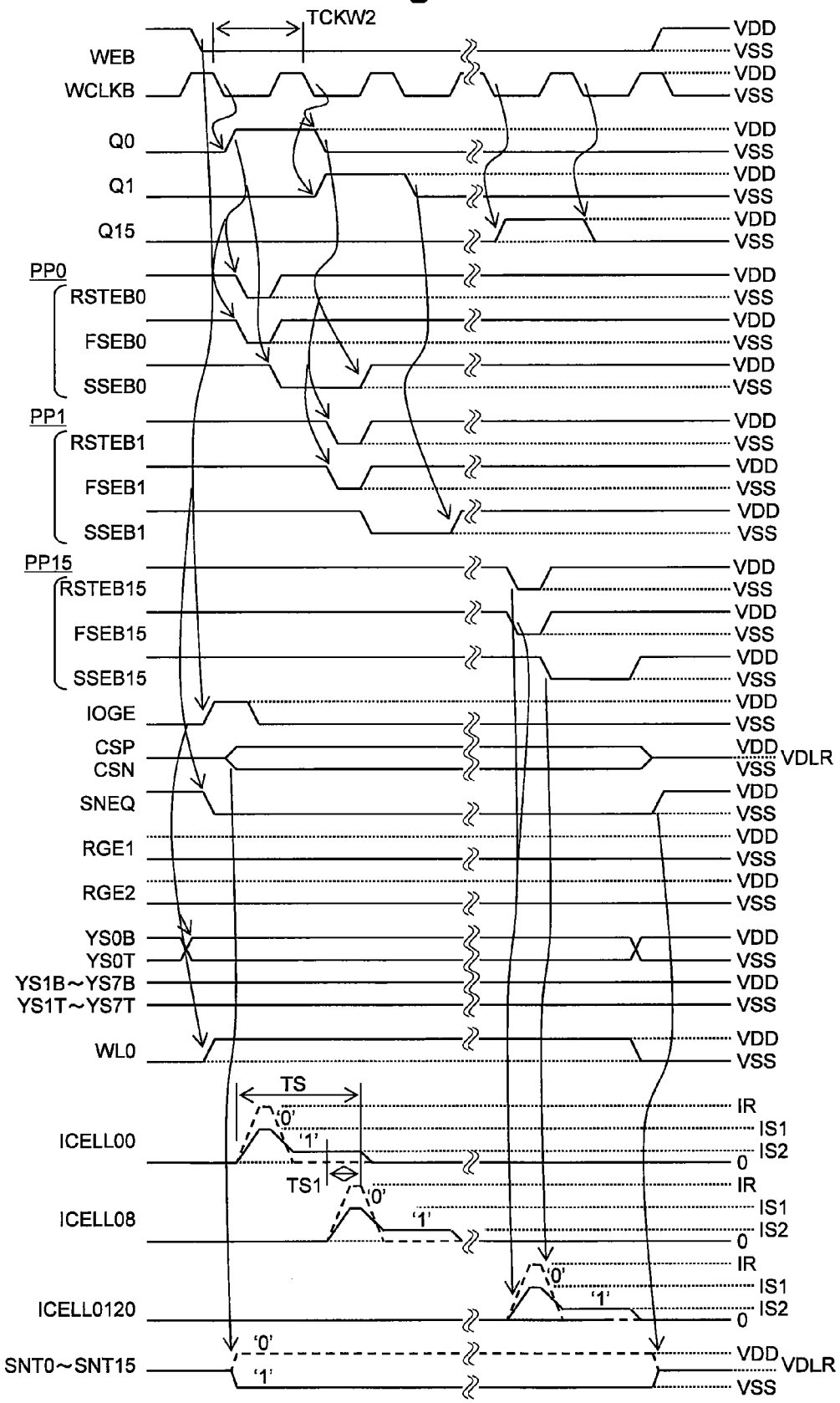
FIG. 11 is a drawing illustrating another example of a timing diagram in rewriting operation of the phase change memory module of FIG. 1, when included in the semiconductor device according to Embodiment 2 of the present invention.

In Embodiment 2, another rewriting operation is explained. FIG. 11 illustrates an example of another timing diagram of a phase change memory module according to Embodiment 2 of the present invention. Here, when the reset current IR which changes a memory device into high resistance (reset) state is smaller than the programming current permitted in a device which employs the phase change memory module, and when a margin of the degree of a second set current IS2 exists, the reset current IR plus the second set current IS2 or the first set current IS1 plus the second set current IS2 can be applied at the same time. Paying attention to this point, the present embodiment accelerates the activation timing of the following memory cells in serial programming. This is the feature of the present embodiment. In the following, focusing on this point, the operation illustrated in FIG. 11 is explained.

First, the operation of the programming controller PCTL is explained. Synchronizing with a falling edge of the programming clock WCLKB, the shift register SREG in the programming controller PCTL generates programming control signals Q0-Q15 in sequence at the interval of a cycle time TCKW2 of the programming clock WCLKB. The programming signal generators PGEN0-PGEN15 receive the corresponding programming control signals Q0-Q15, and generate in sequence the block of programming control signals PP0-PP15 (namely, short reset enable signals RSTB0-RSTB15, the first set enable signals FSEB0-FSEB15, and the second set enable signals SSEB0-SSEB15). Here, since the programming clock cycle time TCKW2 is set shorter than the set time TS, to the same extent as the pulse width TS1 of the reset enable signal or the first set enable signal, a following programming control signal (here Q1) is activated before the set operation of a memory cell (here MC00) is completed. Therefore, the pulse width of the second set enable signals SSEB0-SSEB15 is adjusted so that the time from the fall of the first set enable signal FSEB to the rise of the second set enable signal becomes equal to the set time TS.

Next, the operation of the memory array is explained. When the storage data '0' is to be written in the memory cell MC00, the reset circuit RCKT possessed by the programming circuit PRGM0 included in the read and write circuit RW0 is activated by the reset enable signal RSTB included in the block of programming control signals PP1. Accordingly, as described above, the cell current ICELL00 of a value IR corresponding to the reset voltage VRST is applied to the memory cell MC00. On the other hand, when the storage data '1' is to be written, the set circuit SCKT is activated and the cell current ICELL00 of values IS1 and IS2, respectively corresponding to the first set voltage VSET1 and the second set voltage VSET2, are applied to the memory cell MC00 in sequence. While the second cell current is applied, the block of programming control signals PP1 is activated, synchronizing with the programming control signal Q1. Consequently, the reset current IR or the first set current IS1 is applied to the memory cell MC08. In the case where the storage data '1' is written in the memory cell MC08, the second set current IS2 is further applied. Subsequently, while the present second cell current is applied, the block of programming control signals PP2 is activated, synchronizing with the programming control signal Q2. Consequently, the reset current IR or the first set current IS1 is applied to the memory cell MC016. Hereafter, the programming current is applied in sequence up to the memory cell MC0120 in a similar manner.

By the above-described operation, it becomes possible to shorten the total time required for writing the 16-bit storage data, bit-by-bit in order. That is, it becomes possible to shorten the time required for a serial programming, by making the cycle time TCKW2 of the programming clock WCLKB shorter than the set time TS, and shortening the cycle time of the programming control signals PP0-PP15. Accordingly, it is possible to realize the phase change memory module in which higher-speed rewriting operation is available.

Embodiment 3

Figure 12:
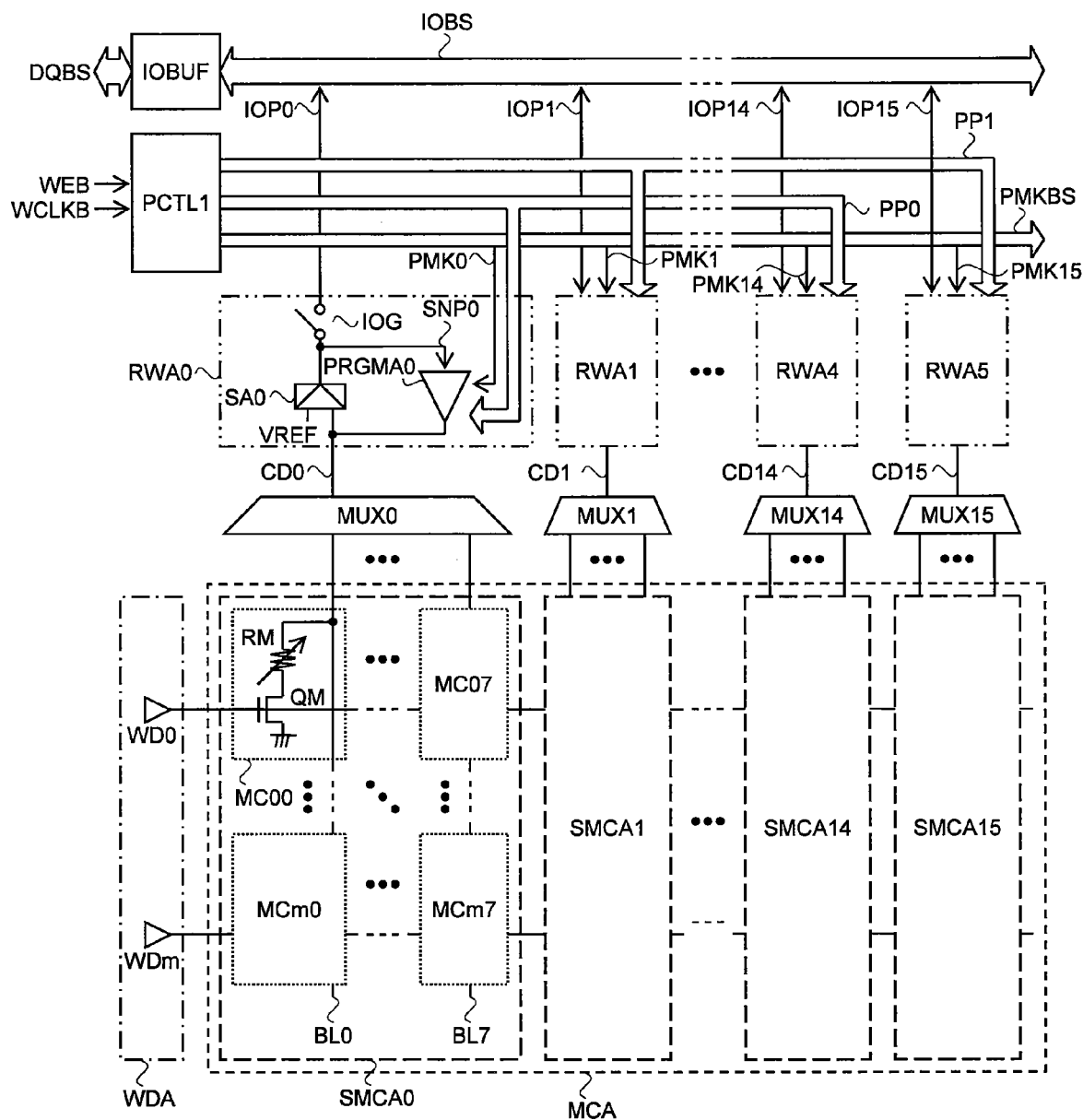
FIG. 12 is a drawing illustrating an example of configuration of a main circuit block of a phase change memory module included in a semiconductor device according to Embodiment 3 of the present invention.
Figure 13:
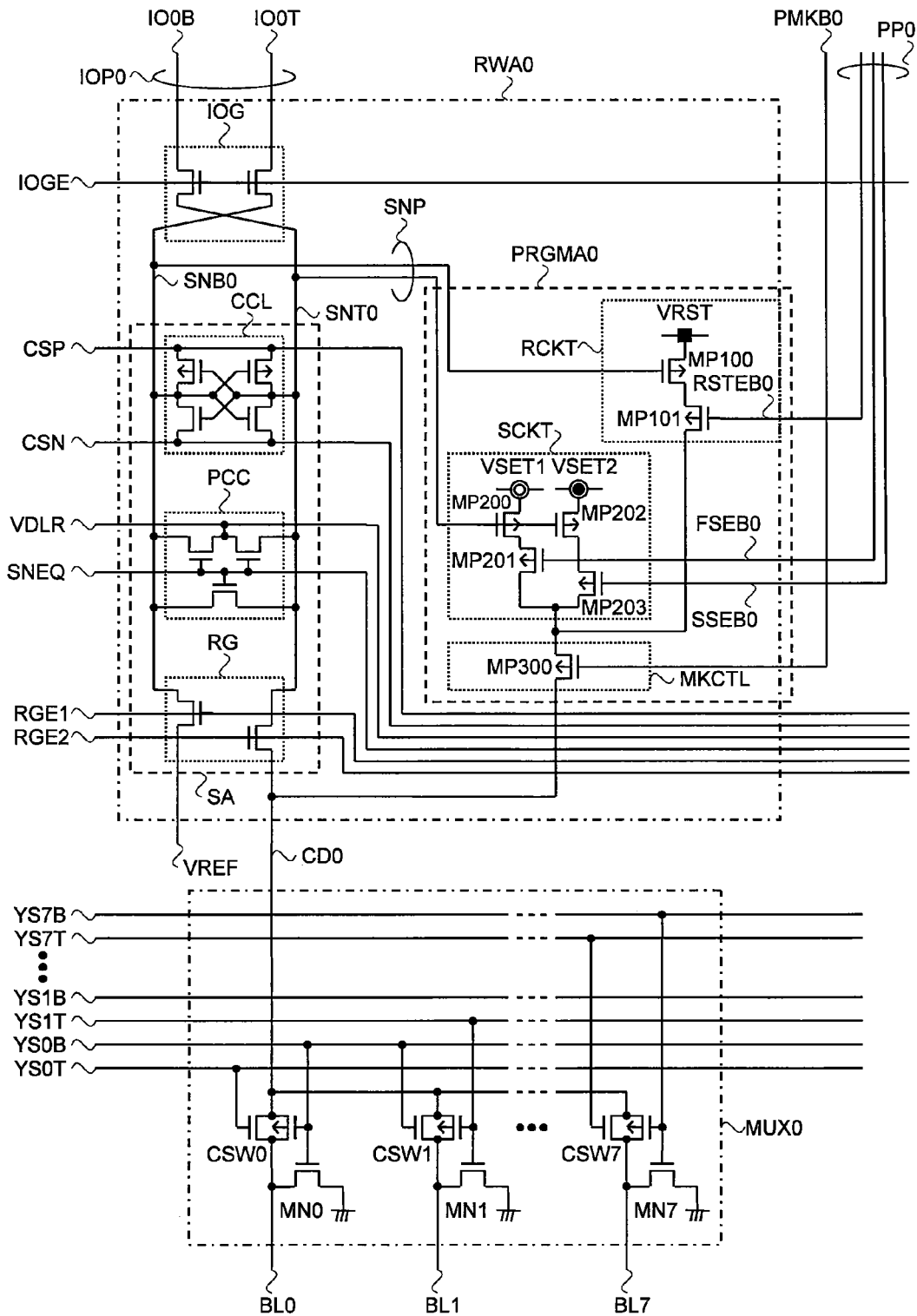
FIG. 13 is a drawing illustrating another example of a detailed configuration of the read and write circuit as illustrated in FIG. 10, which is included in the semiconductor device according to Embodiment 3 of the present invention.
Figure 14:
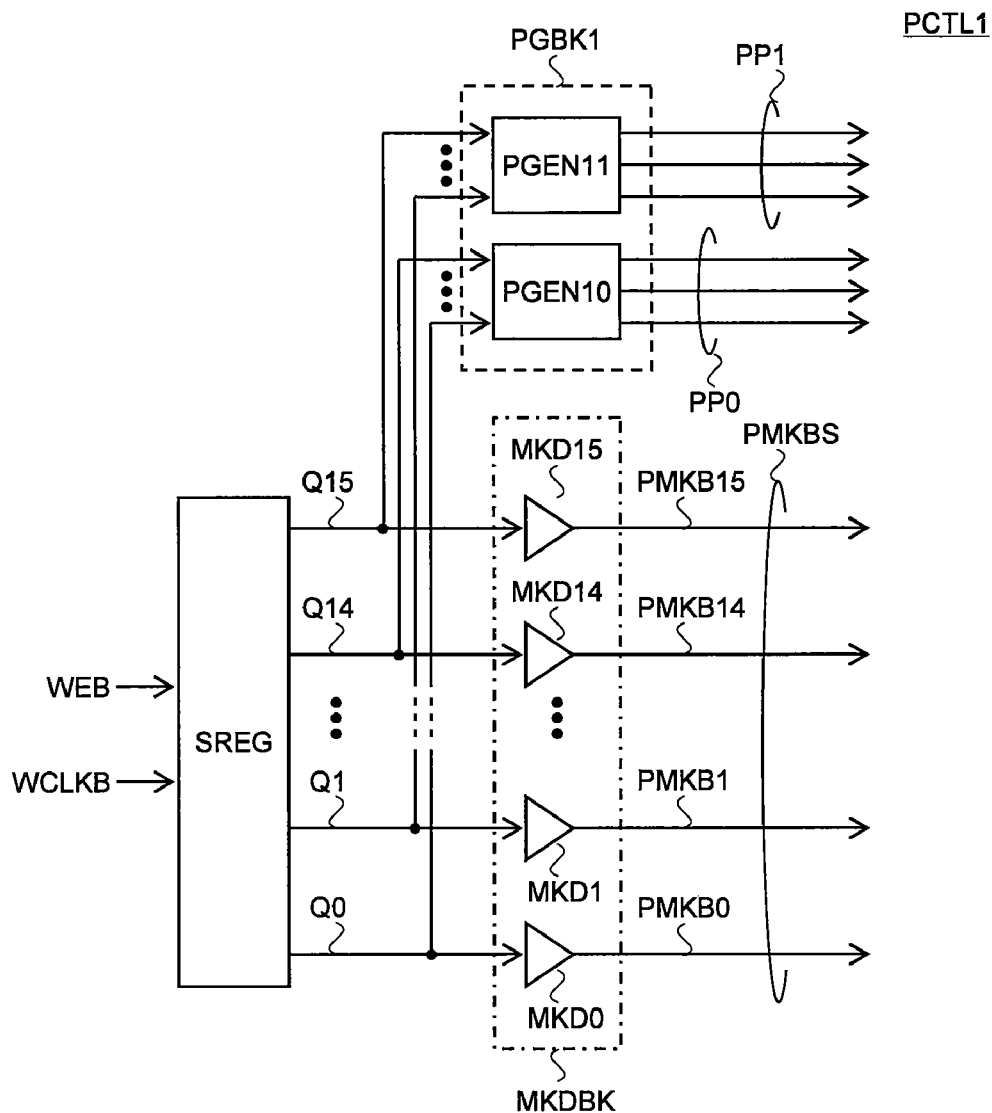
FIG. 14 is a drawing illustrating an example of configuration of a block of programming controller included in the semiconductor device according to Embodiment 3 of the present invention.
Figure 15:
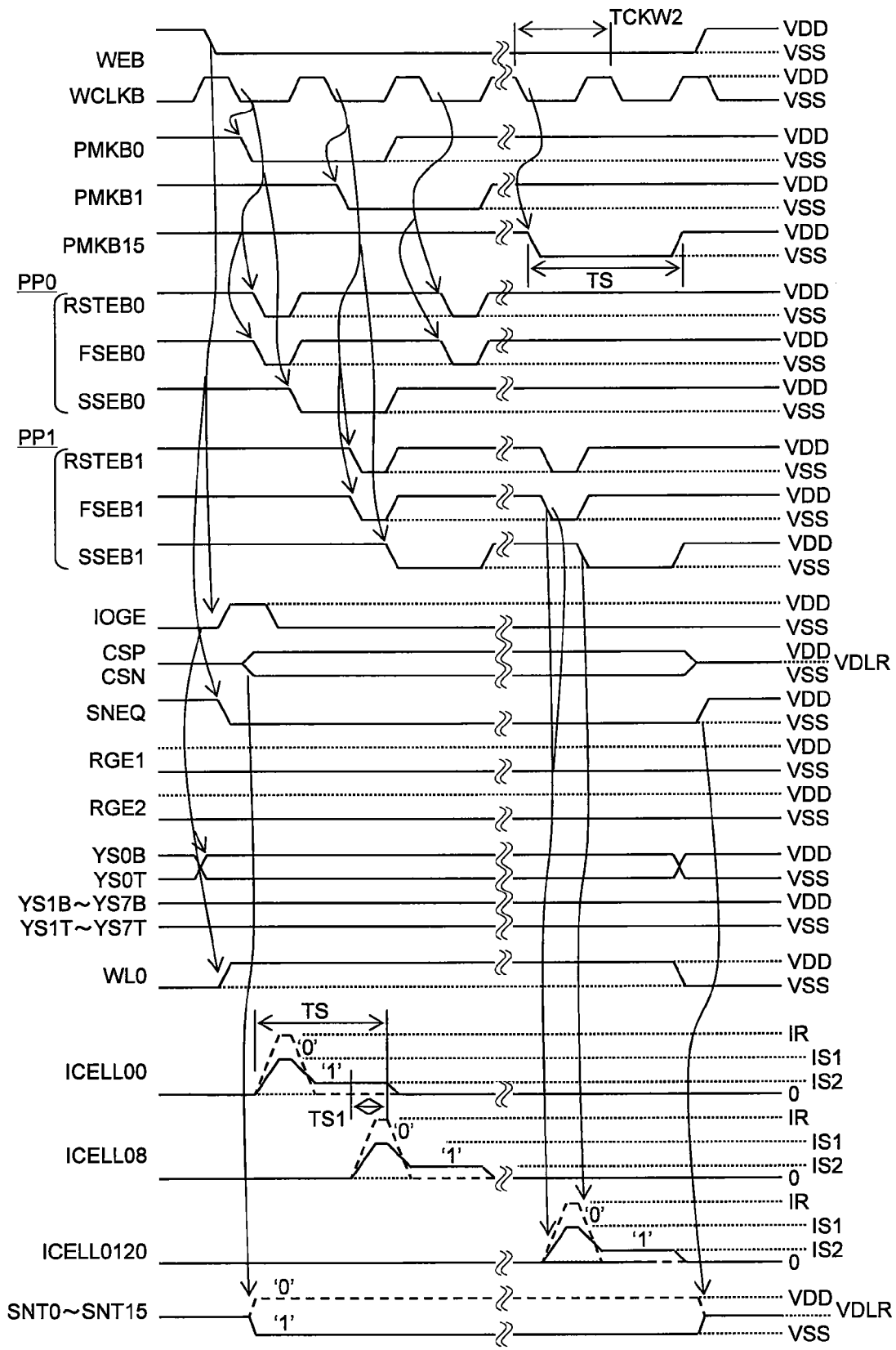
FIG. 15 is a drawing illustrating another example of a timing diagram in rewriting operation of the phase change memory module of FIG. 10 included in the semiconductor device according to Embodiment 3 of the present invention.

In Embodiment 3, another configuration and operation of a phase change memory module are explained. FIG. 12 illustrates an example of configuration of a main circuit block of a phase change memory module according to Embodiment 3 of the present invention. The large difference with the configuration illustrated in FIG. 1 lies in the following two points. First, in contrast to the configuration illustrated in FIG. 1 where the programming signal bus PPBS has 16 lines corresponding to the block of programming control signals PP0-PP15 and each sub-array, the configuration in Embodiment 3 provides only the block of programming control signals PP0 and PP1. The block of programming control signals PP0 is shared by the read and write circuits RWA0, RWA2, - - - , RWA14, which correspond respectively to even-numbered sub-arrays SMCA0, SMCA2, - - - , SMCA14, and the block of programming control signals PP1 is shared by the read and write circuits RW11, RW13, - - - , RW115, which correspond respectively to odd-numbered sub-arrays SMCA1, SMCA3, - - -, SMCA15. Secondly, a programming mask signal bus PMKBS for controlling the programming circuits PRGMA0-PRGMA15 included in the read and write circuits RW0-RW15 is newly provided. With reference to FIGS. 13-15, the following explains in detail the configuration and operation of the phase change memory module illustrated in FIG. 12.

FIG. 13 illustrates an example of configuration of the read and write circuit RWA0 in the phase change memory module illustrated in FIG. 12. The difference between the present circuit and the read and write circuit RW0 illustrated in FIG. 5 lies in the configuration of the programming circuit PRGMA0. To be specific, the difference is in the point in which the reset circuit RCKT and the set circuit SCKT are coupled to the common data line CD0 through a newly inserted mask control circuit MKCTL. The mask control circuit MKCTL has a PMOS transistor MP300, and a programming mask signal PMK0 which is one of the programming mask bus PMKBS is coupled to the gate electrode. When the present programming mask signal PMK0 is driven to the ground voltage VSS, the reset circuit RCKT and the set circuit SCKT are coupled to the common data line CD0, and the rewriting operation is performed.

FIG. 14 illustrates an example of configuration of a programming controller PCTL1 in the phase change memory module illustrated in FIG. 12. The programming controller PCTL1 includes a shift register SREG, a block of programming signal generator PGBK1, and a block of programming mask driver PMKDBK. The shift register SREG has the same function as the function explained in FIG. 6, and receives the programming enable signal WEB and the programming clock WCLKB, and outputs the programming bit control signals Q0-Q15 with respectively different phases. The block of programming signal generator PGBK1 has programming signal generators PGEN0, PGEN1. The programming signal generator PGEN0 receives even-numbered programming bit control signals Q0, Q2, - - -, Q14, and generates the block of programming control signals PP0. Similarly, the programming signal generator PGEN1 receives odd-numbered programming bit control signals Q1, Q3, - - -, Q15, and generates the block of programming control signals 221. The block of programming mask driver PMKDBK has mask drivers MKD0-MKD15. The mask drivers MKD0-MKD15 receive and invert the corresponding programming control signals Q0-Q15 respectively, and output respectively the programming mask signals PMKB0-PMKB15 of which the cycle time is almost equal to the set time TS. The group of programming mask signals PMKB0-PMKB15 will be collectively called a programming mask signal bus PMKBS.

FIG. 15 illustrates an example of a timing diagram in rewriting operation of the phase change memory module illustrated in FIG. 12. The present rewriting operation is modification of the operation illustrated in FIG. 11 where the cycle time TCKW2 of the programming clock WCLKB is shorter than the set time TS. Here, the explanation is made focusing on the operation of the programming controller PCTL1. It is needless to say that the present rewriting operation can also be realized by the operation illustrated in FIG. 7.

First, based on the programming control signals Q0-Q15 (not shown in the figure) which are outputted from the shift register SREG synchronizing with the falling edge of the programming clock WCLKB, the programming mask signals PMKB0-PMKB15 with the pulse width equal to the set time TS are generated in sequence at the interval of the cycle time TCKW2 of the programming clock WCLKB. The block of programming control signals PP0 and PP1 are generated alternately at the interval of the cycle time TCKW2. The read and write circuit RWA0 receives the programming mask signal PMKB0 and the block of programming control signals PP0, which are both driven to the ground voltage VSS, and supplies the memory cell MC00 with the reset current IR or the first set current IS1 and the second set current IS2. Next, the read and write circuit RWA1 receives the programming mask signal PMKB1 and the block of programming control signals PP1, which are both driven to the ground voltage VSS, and supplies the memory cell MC08 with the reset current IR or first set current IS1 and the second set current IS2. Subsequently, the read and write circuit RWA2 receives the programming mask signal PMKB2 (not shown in the figure) and the block of programming control signals PP0, which are both driven to the ground voltage VSS, and supplies the memory cell MC016 with the reset current IR or the first set current IS1 and the second set current IS2. Similarly, the rewriting operation is performed for the rest, and finally, the read and write circuit RWA15 receives the programming mask signal PMKB15 and the block of programming control signals PP1, which are both driven to the ground voltage VSS, and supplies the memory cell MC0120 with the reset current IR or the first set current IS1 and the second set current IS2.

By the above-described configuration and operation, it is possible to reduce the number of control signal in the serial programming operation. That is, the phase change memory module illustrated in FIG. 1 requires the block of programming control signals of 48 lines (three control signals per block of programming control signals). On the other hand, in the present embodiment, the programming mask signal bus PMKBS (including 16-line programming mask signals PMKB0-PMKB15 in the present embodiment) is introduced, and the number of the block of programming control signals is reduced (to two in the present embodiment). As the result, it is possible to perform the serial programming operation using the control signals of 22 lines in total. Therefore, in addition to the effect of Embodiment 1 and Embodiment 2, the serial programming operation is realizable with a small area by reducing the number of wires.

In the above, the invention accomplished by the present inventors has been specifically explained based on the embodiments. However, it cannot be overemphasized that the present invention is not restricted to the embodiments, and it can be changed variously in the range which does not deviate from the gist. For example, there is no necessity that the set current IS1 of the first stage in the set operation is set to the same value as the reset current IS. It is also possible to set the set current IS1 to a value which can maintain the memory device at temperature higher than the crystallization temperature illustrated in FIG. 2. Therefore, the electric current consumption can be suppressed more. When the programming time has a margin, it is possible for the set operation to employ the one-step pulse drive which can realize the temperature waveform illustrated in FIG. 2. Furthermore, when the upper limit of the programming current in a device in which the phase change memory module is employed is large enough, it is also possible to rewrite several bits concurrently. In this case, since the serial programming time is shortened, the throughput of the memory system can be improved further.

In the present embodiment, the reduction of area is realized by using the sense amplifiers SA0-SA15 also as the write buffers. However, the write buffers may be provided separately from the read-out sense amplifiers. When a write buffer is provided between each of the input/output bus IOBS and the programming circuits PRGM0-PRGM15, it becomes possible to release the input/output bus IOBS for other use. That is, if the data holding circuit, which takes in and holds the data transferred in parallel in the input/output bus IOBS, is provided correspondingly to the programming circuit, it becomes possible to release the input/output bus IOBS for other use.

INDUSTRIAL APPLICABILITY

In the present invention, by using the sense amplifier for the programming buffer, activating plural programming circuits by the control signals of different phases, and performing a time-division programming, it is possible to improve the utilization ratio of the data buses of the inside and outside of the phase change memory module and to suppress the programming current. Therefore, the present invention can realize a phase change memory system with high speed performance and low current consumption.

What is claimed is:

1. A semiconductor device comprising:
   a plurality of word lines;
   a first bit line intersecting with the word lines;
   a second bit line intersecting with the word lines;
   a plurality of memory cells disposed at intersecting points of the word lines and the first and second bit lines;
   a plurality of pairs of input/output buses including a first common data line and a second common data line;
   a first data holding circuit and a first programming circuit provided corresponding to the first common data line and the first bit line;
   a second data holding circuit and a second programming circuit provided corresponding to the second common data line and the second bit line; and
   a programming controller operable to control the first and the second programming circuit,
   wherein the first and second data holding circuits fetch in and hold data transferred in parallel along the first and second common data lines,
   wherein the first and the second programming circuit supply the first and second bit lines with a programming voltage, according to the data held in the first and the second data holding circuit, and
   wherein the programming controller generates a plurality of control signals corresponding to each of the first programming circuit and the second programming circuit.

2. The semiconductor device according to claim 1, wherein the control signals differ from each other in phase.

3. The semiconductor device according to claim 1,
   wherein the programming controller provides each of the first programming circuit and the second programming circuit with a plurality of control signals, and
   wherein the control signals differ from each other in pulse width.

4. The semiconductor device according to claim 1,
   wherein each of the memory cells includes a transistor and a storage device with resistance variable as a function of stored data.

5. The semiconductor device according to claim 1,
   wherein the first and the second data holding circuit each amplifies and holds a signal read from each of the memory cells when reading data from the memory cells.

6. The semiconductor device according to claim 5, further comprising:
   a read gate coupled between the first data holding circuit and the first bit line; and
   a pre-charge circuit coupled with the first bit line via the read gate,
   wherein the pre-charge circuit supplies the first bit line with a pre-charge voltage for reading.

7. The semiconductor device according to claim 1,
   wherein the first data holding circuit is coupled with a plurality of bit lines including the first bit line via the first select circuit, and
   wherein the first select circuit selects one of the bit lines and couples the selected bit line to the first data holding circuit.

8. The semiconductor device according to claim 1,
   wherein the programming controller performs control with the use of combination of the first control signal and the second control signal, the first control signal being common to each of the first programming circuit and the second programming circuit, and the second control signal being specific to each of the first programming circuit and the second programming circuit.

9. A semiconductor device comprising:
   a plurality of word lines;
   a plurality of bit lines;
   a plurality of memory cells provided at intersecting points of the plurality of word lines and the plurality of bit lines;
   a plurality of pairs of input/output buses operable to transfer data to be written to the plurality of memory cells;
   a plurality of programming circuits operable to supply the plurality of bit lines with a programming voltage; and
   a plurality of data holding circuits provided corresponding to the plurality of programming circuits,
   wherein the plurality of data holding circuits fetch in and hold data transferred in parallel along the plurality of pairs of input/output buses, and
   wherein each of the programming circuits outputs the programming voltage at different timing according to data held in each of the plurality of data holding circuits.

10. The semiconductor device according to claim 9,
    wherein each of the plurality of memory cells has an element operable to rewrite data by generated heat.

11. The semiconductor device according to claim 9,
    wherein each of the plurality of data holding circuits serves as a sense amplifier which amplifies a signal read from each of the memory cells and holds the amplified signal when data is read from each of the plurality of memory cells.

12. The semiconductor device according to claim 9, further comprising:
    a control circuit operable to output a plurality of control signals for controlling timing at which the plurality of programming circuits supply the programming voltage,
    wherein the control circuit generates the plurality of control signals by varying a phase of one of the plurality of control signals.

13. The semiconductor device according to claim 9, further comprising:
    a plurality of banks coupled to the plurality of common data lines and each having the plurality of data holding circuits,
    wherein, while one of the plurality of banks is performing programming operation, the other banks of the plurality of banks which are not performing programming operation are accessible.

* * * * *